(12) United States Patent
Yang et al.

(10) Patent No.: US 11,337,317 B2
(45) Date of Patent: May 17, 2022

(54) SERVER DEVICE

(71) Applicants: Inventec (Pudong) Technology Corporation, Shanghai (CN); INVENTEC CORPORATION, Taipei (TW)

(72) Inventors: Chih-Kai Yang, Taipei (TW); Ming-Hung Lin, Taipei (TW); Chung-Yi Huang, Taipei (TW); Yu-Wei Liu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/019,727

(22) Filed: Sep. 14, 2020

(65) Prior Publication Data
US 2022/0071028 A1 Mar. 3, 2022

(30) Foreign Application Priority Data
Aug. 25, 2020 (CN) .......................... 202010863176.5

(51) Int. Cl.
*H05K 5/02* (2006.01)
*H05K 5/03* (2006.01)
*H05K 7/20* (2006.01)

(52) U.S. Cl.
CPC ......... *H05K 5/0213* (2013.01); *H05K 5/0239* (2013.01); *H05K 5/03* (2013.01); *H05K 7/20145* (2013.01); *H05K 7/20163* (2013.01)

(58) Field of Classification Search
CPC ...... H05K 5/0213; H05K 5/0239; H05K 5/03; H05K 7/20145; H05K 7/20163; H05K 7/2039; H05K 7/20409; H05K 7/20418; H05K 7/20545; H05K 7/20809;
(Continued)

(56) References Cited

U.S. PATENT DOCUMENTS

| | | | |
|---|---|---|---|
| 6,618,248 B1 * | 9/2003 | Dalheimer | G06F 1/18 361/679.33 |
| 7,957,132 B2 * | 6/2011 | Fried | F28D 15/0266 361/679.47 |
| 11,067,963 B2 * | 7/2021 | Eiland | G06F 1/206 |

(Continued)

*Primary Examiner* — Stephen S Sul
(74) *Attorney, Agent, or Firm* — Locke Lord LLP; Tim Tingkang Xia, Esq.

(57) ABSTRACT

The invention provides a server device. The server device includes a casing, an electronic assembly, and a heat dissipation assembly. The casing includes a housing and a partition. The partition is disposed in the housing and forms an accommodation space and a heat dissipation space in the housing that are not communicated with each other. The housing has a plurality of first vent holes communicated with the heat dissipation space. The electronic assembly is located in the accommodation space. The heat dissipation assembly includes a heat dissipation component and a heat pipe. The heat dissipation component is located in the heat dissipation space. The heat pipe includes a heat absorption portion and a condensation portion connected to each other. The heat pipe is disposed through the partition, the heat absorption portion is thermally coupled to the electronic assembly, and the condensation portion is coupled to the heat dissipation component.

3 Claims, 4 Drawing Sheets

(58) Field of Classification Search
CPC .. H05K 7/20181; H05K 7/20172; G06F 1/20; G06F 1/203
See application file for complete search history.

(56) References Cited

U.S. PATENT DOCUMENTS

| | | | | |
|---|---|---|---|---|
| 2007/0125523 | A1* | 6/2007 | Bhatti | G06F 1/20 |
| | | | | 165/104.33 |
| 2008/0123292 | A1* | 5/2008 | Wobig | G06F 1/20 |
| | | | | 361/695 |
| 2009/0021910 | A1* | 1/2009 | Lai | H05K 7/20181 |
| | | | | 361/695 |
| 2009/0116186 | A1* | 5/2009 | Wei | F28D 1/0477 |
| | | | | 361/690 |
| 2011/0108250 | A1* | 5/2011 | Horng | G06F 1/28 |
| | | | | 165/121 |
| 2011/0222237 | A1* | 9/2011 | Fujiwara | G06F 1/20 |
| | | | | 361/679.48 |
| 2013/0155622 | A1* | 6/2013 | Chang | H05K 7/20809 |
| | | | | 361/720 |
| 2015/0062805 | A1* | 3/2015 | Katsumata | F28D 15/0275 |
| | | | | 361/679.49 |
| 2017/0242462 | A1* | 8/2017 | Fujiwara | H05K 7/20336 |
| 2017/0280592 | A1* | 9/2017 | Lai | G06F 1/20 |
| 2019/0200486 | A1* | 6/2019 | Adrian | G11B 33/08 |
| 2020/0218317 | A1* | 7/2020 | Shu | F28D 15/0275 |
| 2020/0265178 | A1* | 8/2020 | Hodes | H05K 7/20281 |

\* cited by examiner

SERVER DEVICE

CROSS-REFERENCE TO RELATED APPLICATIONS

This non-provisional application claims priority under 35 U.S.C. § 119(a) on Patent Application No(s). 202010863176.5 filed in China on Aug. 25, 2020, the entire contents of which are hereby incorporated by reference.

BACKGROUND OF THE INVENTION

Technical Field of the Invention

The invention relates to a server device, more particularly to a server device having a partition.

Description of the Related Art

A server can be served for providing functionalities for high traffic websites, independent email systems, large database managements, data processing for enterprises, and so on. During the data transmission or processing, the hardware in the server, such as processing unit and data storage device, will generate waste heat to increase the working temperature of the server. Thus, it is important to keep the server cool.

One of the known solutions is air cooling. A typical active air cooling system includes a fan to force air to flow through heatsinks in thermal contact with heat sources, taking away the heat absorbed by the heatsink. Without the fan, the air cooling becomes passive cooling, and the airflow is only caused by the temperature difference between the interior and exterior of the server.

It is known that the larger the vent holes are, the better the heat dissipation of the airflow. But a large vent hole is easier to introduce dust or particles into the server to damage the internal electronic components. And the large vent hole tends to reveal the light emitted by the internal electronic components not supposed to be seen from outside. Therefore, how to find a balance between the heat dissipation performance and the prevention of dust and particles becomes a topic in this field.

SUMMARY OF THE INVENTION

The invention provides a server device capable of having an improved heat dissipation efficiency while preventing dust or unwanted particles from entering into the server.

One embodiment of the invention provides a server device. The server device includes a casing, an electronic assembly, and a heat dissipation assembly. The casing includes a housing and a partition. The partition is disposed in the housing and forms an accommodation space and a heat dissipation space in the housing that are not communicated with each other. The housing has a plurality of first vent holes communicated with the heat dissipation space. The electronic assembly is located in the accommodation space. The heat dissipation assembly includes a heat dissipation component and a heat pipe. The heat dissipation component is located in the heat dissipation space. The heat pipe includes a heat absorption portion and a condensation portion connected to each other. The heat pipe is disposed through the partition, the heat absorption portion is thermally coupled to the electronic assembly, and the condensation portion is coupled to the heat dissipation component.

Another embodiment of the invention provides a server device. The server device includes a casing, an electronic assembly, and a heat dissipation assembly. The casing includes a housing and a partition. The partition is disposed in the housing and forms an accommodation space and a heat dissipation space in the housing. The electronic assembly is located in the accommodation space. The heat dissipation assembly includes a heat dissipation component and a heat pipe. The heat dissipation component is located in the heat dissipation space. The heat pipe includes a heat absorption portion and a condensation portion connected to each other. The heat pipe is disposed through the partition, the heat absorption portion is thermally coupled to the electronic assembly, and the condensation portion is coupled to the heat dissipation component. The partition has a plurality of through holes, the accommodation space is communicated with the heat dissipation space via the through holes. The housing has a plurality of first vent holes, and sizes of the through holes is smaller than sizes of the first vent holes.

According to the server devices as discussed above, the partition divides the internal space of the housing into the accommodation space and the heat dissipation space while the parts that surround the heat dissipation space have large-sized first vent holes but the other parts that surround the accommodation space have no vent hole thereon or only have small-sized second vent holes and/or through holes, thus heat in the heat dissipation space can flow out of the housing via the first vent holes, and dust or unwanted particles are prevented from easily entering into the accommodation space.

BRIEF DESCRIPTION OF THE DRAWINGS

The present invention will become more fully understood from the detailed description given hereinbelow and the accompanying drawings which are given by way of illustration only and thus are not limitative to the present invention and wherein.

DETAILED DESCRIPTION

Figure 1:
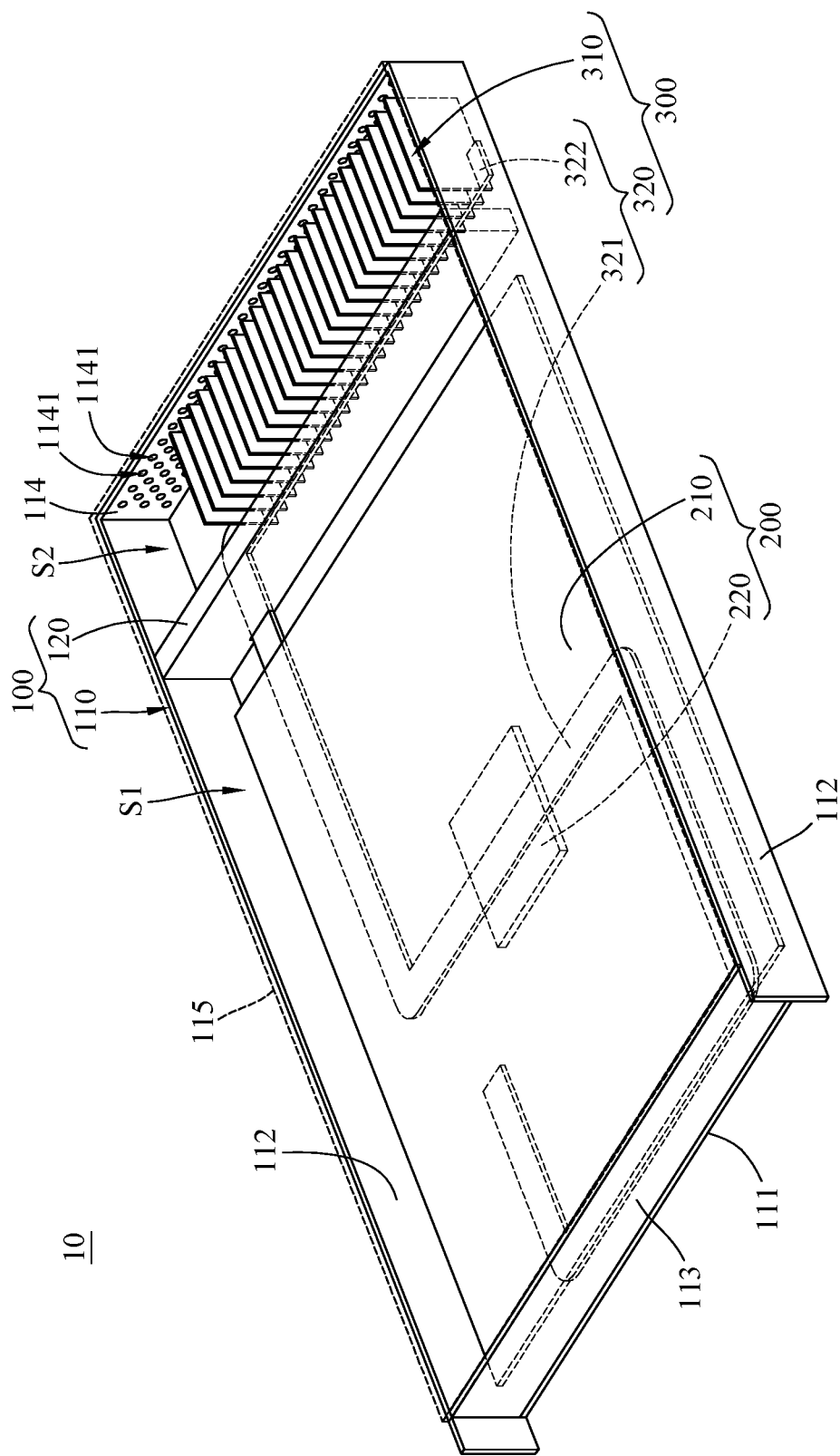
FIG. 1 is a perspective view of a server device according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
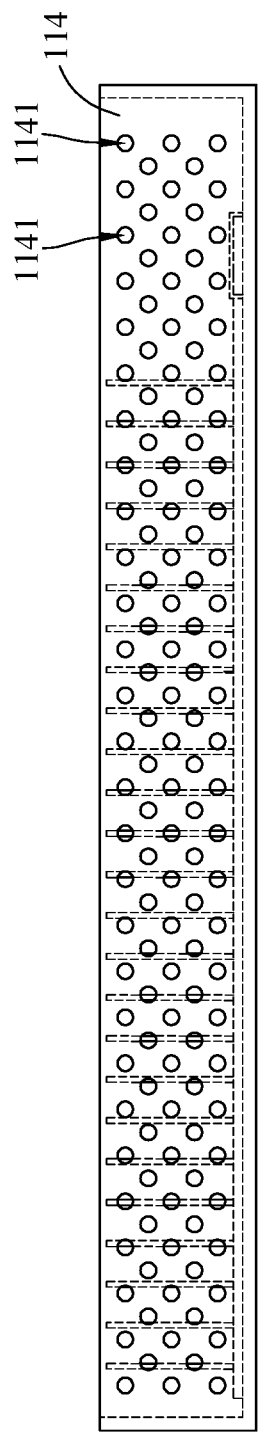
FIG. 2 is a rear view of the server device in FIG. 1.

Referring to FIGS. 1 and 2, there are shown a perspective view of a server device 10 according to a first embodiment of the invention and a rear view of the server device 10 in FIG. 1.

In this embodiment, the server device 10 is, for example, a 1 U, 2 U, 3 U or 4 U casing server. The server device 10 includes a casing 100, an electronic assembly 200, and a heat dissipation assembly 300.

The casing 100 includes a housing 110 and a partition 120. The housing 110 includes a bottom plate 111, two lateral plates 112, a front plate 113, a rear plate 114, and a top plate 115. The lateral plates 112, the front plate 113 and the rear plate 114 are respectively connected to different sides of the bottom plate 111. Different sides of the top plate 115 are respectively connected to sides of the lateral plates 112, the front plate 113, and the rear plate 114 located away from the bottom plate 111. The partition 120 is made of fireproof material. The partition 120 is located between the front plate 113 and the rear plate 114, and different sides of the partition 120 are respectively connected to the bottom plate 111, the top plate 115, and the lateral plates 112. The partition 120 is disposed in the housing 110 and divides the internal space of the housing 110 into an accommodation space S1 and a heat dissipation space S2. The accommodation space S1 and the heat dissipation space S2 are separated by the partition 120 so that they are not communicated with each other.

In this embodiment, the rear plate 114 has a plurality of first vent holes 1141 connected to the heat dissipation space S2 but not communicated with the accommodation space S1. As such, heat in the heat dissipation space S2 can flow out of the housing 110 via the first vent holes 1141 but dust or unwanted particles are unable to reach the accommodation space S1.

The electronic assembly 200 is located in the accommodation space S1. The electronic assembly 200 includes a circuit board 210 and a heat source 220. The circuit board 210 is mounted on the bottom plate 111 of the housing 110. The heat source 220 is mounted on a side of the circuit board 210 located close to the bottom plate 111.

Note that the location of the heat source 220 on the circuit board 210 is not limited and not intended to limit the invention; in some other embodiments, the heat source may be mounted on a side of the circuit board located away from the bottom plate.

The heat dissipation assembly 300 includes a heat dissipation component 310 and a heat pipe 320. The heat dissipation component 310 is, for example, a heat sink. The heat dissipation component 310 is located in the heat dissipation space S2. The heat pipe 320 includes a heat absorption portion 321 and a condensation portion 322 connected to each other. The heat pipe 320 is disposed through the partition 120. The heat absorption portion 321 is thermally coupled to the heat source 220 of the electronic assembly 200, and the condensation portion 322 is coupled to the heat dissipation component 310, such that heat generated by the heat source 220 can be conducted to the heat dissipation component 310 in the heat dissipation space S2 via the heat pipe 320.

In this embodiment, the connection between the partition 120 and the heat pipe 320 may be provided a waterproof glue to ensure that the joint of the partition 120 and the heat pipe 320 is fully sealed and therefore ensure the disconnection between the accommodation space S1 and the heat dissipation space S2. Note that the waterproof glue is optional. In some other embodiments, the joint of the partition and the heat pipe may not be sealed by the waterproof glue so that, when there is no need to require waterproofness of the accommodation space S1, such that the accommodation space and the heat dissipation space may be communicated with each other.

As discussed, the partition 120 divides the internal space of the housing 110 into the accommodation space S1 and the heat dissipation space S2, and there is no hole on the plates that can expose the accommodation space S1, such that dust or unwanted particles is prevented from entering into the accommodation space S1 served to accommodate the electronic assembly 200. Note that there is no electronic component in the heat dissipation space S2, thus the first vent holes 1141 of the rear plate 114 may be enlarged in size to achieve a large open area of the rear plate 114. The open area is a ratio that reflects how much of the plate is occupied by vents, normally expressed by percent. For example, the open area of the rear plate 114 may be up to 40% to 50% or over 80%. As a result, the rear plate 114 has a sufficient empty space for airflow and thus improving the heat dissipation efficiency of the server device 10.

Figure 3:
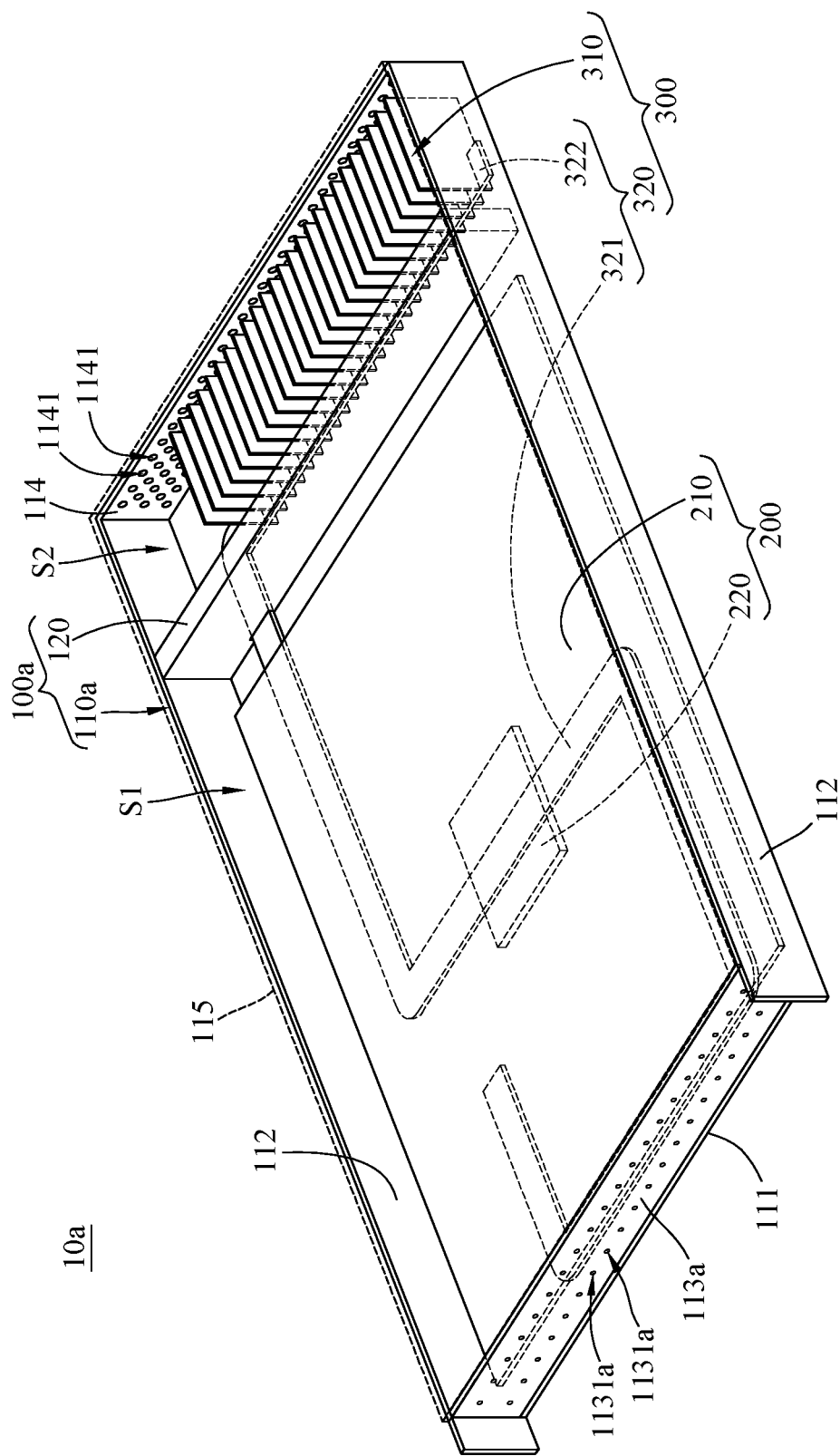
FIG. 3 is a perspective view of a server device according to a second embodiment of the invention.

Referring to FIG. 3, there is shown a perspective view of a server device 10a according to a second embodiment of the invention.

In this embodiment, the server device 10a is, for example, a 1 U, 2 U, 3 U or 4 U casing server. The server device 10a includes a casing 100a, an electronic assembly 200 and a heat dissipation assembly 300.

The casing 100a includes a housing 110a and a partition 120. The housing 110a includes a bottom plate 111, two lateral plates 112, a front plate 113a, a rear plate 114, and a top plate 115. The lateral plates 112, the front plate 113a, and the rear plate 114 are respectively connected to different sides of the bottom plate 111. Different sides of the top plate 115 are respectively connected to sides of the lateral plates 112, the front plate 113a, and the rear plate 114 located away from the bottom plate 111. The partition 120 is made of a fireproof material. The partition 120 is located between the front plate 113a and the rear plate 114, and different sides of the partition 120 are respectively connected to the bottom plate 111, the top plate 115, and the lateral plates 112. The partition 120 is disposed in the housing 110a and divides the internal space of the housing 110a into an accommodation space S1 and a heat dissipation space S2. The accommodation space S1 and the heat dissipation space S2 are separated by the partition 120 so that they are not communicated with each other.

In this embodiment, the rear plate 114 has a plurality of first vent holes 1141 communicated with the heat dissipation space S2 but not communicated with the accommodation space S1. The front plate 113a has a plurality of second vent holes 1131a communicated with the accommodation space S1, and sizes of the second vent holes 1131a are smaller than sizes of the first vent holes 1141. As such, heat in the heat dissipation space S2 can be flow out of the housing 110a via the first vent holes 1141, and dust or unwanted particles may not easily enter into the accommodation space S1 via the second vent holes 1131a.

The electronic assembly 200 is located in the accommodation space S1. The electronic assembly 200 includes a circuit board 210 and a heat source 220. The circuit board 210 is mounted on the bottom plate 111 of the housing 110a. The heat source 220 is mounted on a side of the circuit board 210 located close to the bottom plate 111.

Note that the location of the heat source 220 on the circuit board 210 is not limited and not intended to limit the invention; in some other embodiments, the heat source may be mounted on a side of the circuit board located away from the bottom plate.

The heat dissipation assembly 300 includes a heat dissipation component 310 and a heat pipe 320. The heat dissipation component 310 is, for example, a heat sink. The heat dissipation component 310 is located in the heat dissipation space S2. The heat pipe 320 includes a heat absorption portion 321 and a condensation portion 322 connected to each other. The heat pipe 320 is disposed through the partition 120. The heat absorption portion 321 is thermally coupled to the heat source 220 of the electronic assembly 200, and the condensation portion 322 is coupled to the heat dissipation component 310, such that heat generated by the heat source 220 can be conducted to the heat dissipation component 310 in the heat dissipation space S2 via the heat pipe 320.

In this embodiment, the partition 120 divides the internal space of the housing 110a into the accommodation space S1 and the heat dissipation space S2, and the sizes of the second vent holes 1131a of the front plate 113a is smaller than the first vent holes 1141 of the rear plate 114, and the open area of the rear plate 114 may be further larger than the open area of the front plate 113a. Therefore, the smaller second vent holes 1131a can prevent dust or unwanted particles from easily entering into the accommodation space S1 served to accommodate the electronic assembly 200, and the rear plate 114 having larger open area can increase the heat dissipation efficiency of the server device 10a.

Figure 4:
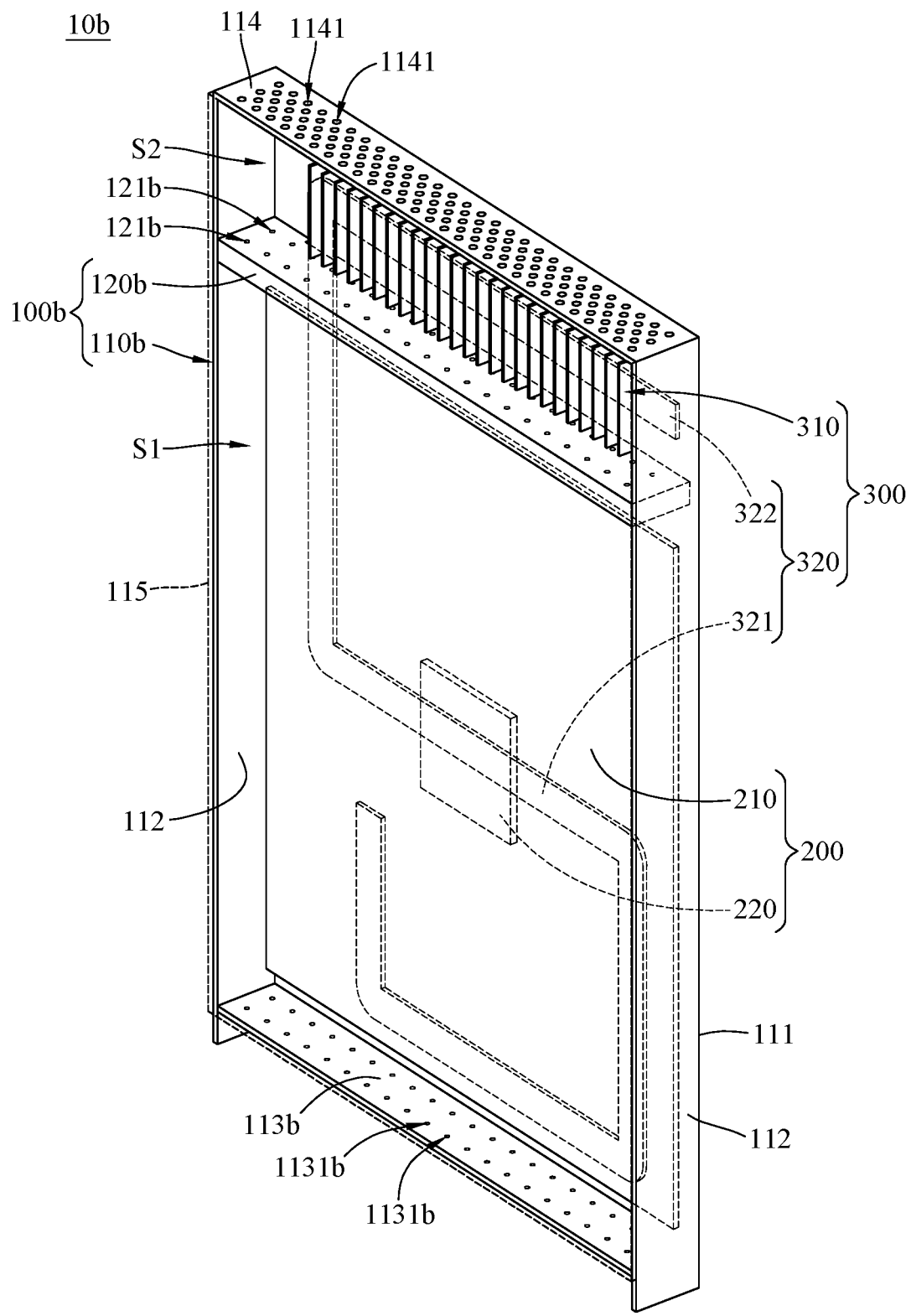
FIG. 4 is a perspective view of a server device according to a fourth embodiment of the invention.

Referring to FIG. 4, there is shown a perspective view of a server device 10b according to a fourth embodiment of the invention.

In this embodiment, the server device 10b is, for example, a 1 U, 2 U, 3 U or 4 U casing server, and can be vertically placed. The server device 10b includes a casing 100b, an electronic assembly 200 and a heat dissipation assembly 300.

The casing 100b includes a housing 110b and a partition 120b. The housing 110b includes a bottom plate 111, two lateral plates 112, a front plate 113b, a rear plate 114, and a top plate 115. The lateral plates 112, the front plate 113b, and the rear plate 114 are respectively connected to different sides of the bottom plate 111. Different sides of the top plate 115 are respectively connected to sides of the lateral plates 112, the front plate 113b, and the rear plate 114 located away from the bottom plate 111. The partition 120b is made of a fireproof material and has a plurality of through hole 121b. The partition 120b is located between the front plate 113b and the rear plate 114, and different sides of the partition 120b are respectively connected to the bottom plate 111, the top plate 115, and the lateral plates 112. The partition 120b is disposed in the housing 110b and divides the internal space of the housing 110b into an accommodation space S1 and a heat dissipation space S2 communicated with each other.

In this embodiment, the rear plate 114 has a plurality of first vent holes 1141. The first vent holes 1141 are communicated with the heat dissipation space S2 and are communicated with the accommodation space S1 via the through holes 121b of the partition 120b. The front plate 113b has a plurality of second vent holes 1131b communicated with the accommodation space S1. The sizes of the second vent hole 1131b are smaller than the sizes of the first vent holes 1141, and the sizes of the through holes 121b are smaller than the sizes of the first vent holes 1141. As such, heat in the heat dissipation space S2 can flow out of the housing 110b via the first vent holes 1141, and dust or unwanted particles may not easily enter into the accommodation space S1 via the second vent holes 1131b and the through holes 121b.

The electronic assembly 200 is located in the accommodation space S1. The electronic assembly 200 includes a circuit board 210 and a heat source 220. The circuit board 210 is mounted on the bottom plate 111 of the housing 110b. The heat source 220 is mounted on a side of the circuit board 210 located close to the bottom plate 111.

Note that the location of the heat source 220 on the circuit board 210 is not limited and not intended to limit the invention; in some other embodiments, the heat source may be mounted on a side of the circuit board located away from the bottom plate.

The heat dissipation assembly 300 includes a heat dissipation component 310 and a heat pipe 320. The heat dissipation component 310 is, for example, a heat sink. The heat dissipation component 310 is located in the heat dissipation space S2. The heat pipe 320 includes a heat absorption portion 321 and a condensation portion 322 connected to each other. The heat pipe 320 is disposed through the partition 120. The heat absorption portion 321 is thermally coupled to the heat source 220 of the electronic assembly 200, and the condensation portion 322 is coupled to the heat dissipation component 310, such that heat generated by the heat source 220 can be conducted to the heat dissipation component 310 in the heat dissipation space S2 via the heat pipe 320.

In this embodiment, the partition 120b divides the internal space of the housing 110b into the accommodation space S1 and the heat dissipation space S2, and the sizes of the second vent holes 1131b of the front plate 113b and the through holes 121b of the partition 120b are smaller than the sizes of the first vent holes 1141 of the rear plate 114, and the open area of the rear plate 114 may be further larger than the open areas of the front plate 113b and the partition 120b. Therefore, the smaller second vent holes 1131a and through holes 121b can prevent dust or unwanted particles from easily entering into the accommodation space S1 accommodating the electronic assembly 200, and the rear plate 114 having larger open area can increase the heat dissipation efficiency of the server device 10b.

In addition, when the server device 10b is vertically placed, the second vent holes 1131b of the front plate 113b, the accommodation space S1, the through holes 121b of the partition 120b, the heat dissipation space S2 and the first vent holes 114 of the rear plate 114 together form a vertical air channel so as to achieve a stack effect, thereby further increasing the heat dissipation efficiency of the server device 10b.

According to the server devices as discussed above, the partition divides the internal space of the housing into the accommodation space and the heat dissipation space while the parts that surround the heat dissipation space have large-sized first vent holes but the other parts that surround the accommodation space have no vent hole thereon or only have small-sized second vent holes and/or through holes, thus heat in the heat dissipation space can flow out of the housing via the first vent holes, and dust or unwanted particles are prevented from easily entering into the accommodation space.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A server device, comprising:
a casing, comprising a housing and a partition, wherein the partition is disposed in the housing and forms an accommodation space and a heat dissipation space in the housing;
an electronic assembly, located in the accommodation space; and
a heat dissipation assembly, comprising a heat dissipation component and a heat pipe, wherein the heat dissipation component is located in the heat dissipation space, the heat pipe comprises a heat absorption portion and a condensation portion connected to each other, the heat pipe is disposed through the partition, the heat absorption portion is thermally coupled to the electronic assembly, and the condensation portion is coupled to the heat dissipation component;
wherein the partition has a plurality of through holes, the accommodation space communicates with the heat dissipation space via the plurality of through holes, the housing has a plurality of first vent holes, and wherein a size of each through hole of the plurality of through holes is smaller than a size of each first vent hole of the plurality of first vent holes.

2. The server device according to claim 1, wherein the housing comprises a bottom plate, two lateral plates, a front plate, a rear plate, and a top plate; the two lateral plates, the front plate, and the rear plate are respectively connected to different sides of the bottom plate; different sides of the top plate are respectively connected to sides of the two lateral plates, the front plate, and the rear plate located away from the bottom plate; the partition is located between the front plate and the rear plate; different sides of the partition are respectively connected to the bottom plate, the top plate, and the two lateral plates; the plurality of first vent holes are located at the rear plate; and an open area of the rear plate is larger than an open area of the partition.

3. The server device according to claim 2, wherein the front plate has a plurality of second vent holes, the plurality of second vent holes communicate with the heat dissipation space via the accommodation space, and wherein the size of each first vent hole of the plurality of first vent holes is larger than a size of each second vent hole of the plurality of second vent holes.

* * * * *